(12) United States Patent
Greenberg et al.

(10) Patent No.: US 10,901,402 B2
(45) Date of Patent: Jan. 26, 2021

(54) CLOSED-LOOP AUTOMATIC DEFECT INSPECTION AND CLASSIFICATION

(71) Applicant: Applied Materials Israel Ltd., Rehovot (IL)

(72) Inventors: Gadi Greenberg, Tel Aviv (IL); Idan Kaizerman, Meitar (IL); Zeev Zohar, Migdal (IL)

(73) Assignee: APPLIED MATERIALS ISRAEL, LTD., Rehovot (IL)

( * ) Notice: Subject to any disclaimer, the term of this patent is extended or adjusted under 35 U.S.C. 154(b) by 0 days.

(21) Appl. No.: 16/174,070

(22) Filed: Oct. 29, 2018

(65) Prior Publication Data

US 2019/0121331 A1 Apr. 25, 2019

Related U.S. Application Data

(63) Continuation of application No. 13/948,118, filed on Jul. 22, 2013, now Pat. No. 10,114,368.

(51) Int. Cl.
*G06T 7/00* (2017.01)
*G05B 19/418* (2006.01)
*H01J 37/00* (2006.01)
*H01L 21/66* (2006.01)

(52) U.S. Cl.
CPC ...... *G05B 19/41875* (2013.01); *G06T 7/0004* (2013.01); *H01J 37/00* (2013.01); *G05B 2219/45031* (2013.01); *G05B 2219/50064* (2013.01); *G06T 2207/10061* (2013.01); *G06T 2207/30148* (2013.01); *H01J 2237/2817* (2013.01); *H01L 22/20* (2013.01)

(58) Field of Classification Search
None
See application file for complete search history.

(56) References Cited

U.S. PATENT DOCUMENTS

| | | | |
|---|---|---|---|
| 5,963,662 A * | 10/1999 | Vachtsevanos | G01N 21/88 250/332 |
| 5,991,699 A | 11/1999 | Kulkarni et al. | |
| 6,148,099 A | 11/2000 | Lee et al. | |
| 6,195,458 B1 | 2/2001 | Warnick et al. | |
| 6,256,093 B1 | 7/2001 | Ravid et al. | |

(Continued)

FOREIGN PATENT DOCUMENTS

| CN | 1917416 A | 2/2007 |
|---|---|---|
| CN | 102648646 A | 8/2012 |

(Continued)

OTHER PUBLICATIONS

Ou, Guobin, and Yi Lu Murphey. "Multi-class pattern classification using neural networks." Pattern Recognition 40, No. 1 (2007): 4-18.

(Continued)

*Primary Examiner* — Vikkram Bali
(74) *Attorney, Agent, or Firm* — Lowenstein Sandler LLP

(57) ABSTRACT

Inspection apparatus includes an imaging module, which is configured to capture images of defects at different, respective locations on a sample. A processor is coupled to process the images so as to automatically assign respective classifications to the defects, and to autonomously control the imaging module to continue capturing the images responsively to the assigned classifications.

11 Claims, 1 Drawing Sheet

(56) References Cited

U.S. PATENT DOCUMENTS

| | | |
|---|---|---|
| 6,288,782 B1 | 9/2001 | Worster et al. |
| 6,292,582 B1 | 9/2001 | Lin et al. |
| 6,650,779 B2 | 11/2003 | Vachtesvanos et al. |
| 6,763,130 B1 | 7/2004 | Somekh et al. |
| 6,922,482 B1 | 7/2005 | Ben-Porath |
| 6,999,614 B1 | 2/2006 | Bakker et al. |
| 7,106,434 B1 | 9/2006 | Mapoles et al. |
| 7,113,628 B1 | 9/2006 | Obara et al. |
| 7,318,051 B2 | 1/2008 | Weston et al. |
| 7,379,175 B1* | 5/2008 | Stokowski ....... G01N 21/95607 356/237.5 |
| 7,570,796 B2 | 8/2009 | Zafar et al. |
| 7,570,800 B2 | 8/2009 | Lin et al. |
| 7,684,609 B1 | 3/2010 | Toth et al. |
| 7,756,320 B2 | 7/2010 | Honda et al. |
| 7,756,658 B2 | 7/2010 | Kulkarni et al. |
| 8,112,241 B2 | 2/2012 | Xiong |
| 8,175,373 B2 | 5/2012 | Abbott et al. |
| 8,194,968 B2 | 6/2012 | Park et al. |
| 8,315,453 B2 | 11/2012 | Shlain et al. |
| 8,502,146 B2 | 8/2013 | Chen et al. |
| 8,983,179 B1 | 3/2015 | Yu et al. |
| 2002/0159641 A1 | 10/2002 | Whitney et al. |
| 2002/0159643 A1 | 10/2002 | DeYong et al. |
| 2002/0165837 A1 | 11/2002 | Zhang et al. |
| 2002/0168099 A1 | 11/2002 | Noy |
| 2002/0174344 A1 | 11/2002 | Ting |
| 2003/0167267 A1 | 9/2003 | Kawatani |
| 2004/0013304 A1 | 1/2004 | Viola et al. |
| 2004/0034612 A1 | 2/2004 | Mathewson et al. |
| 2004/0126909 A1 | 7/2004 | Obara et al. |
| 2004/0156540 A1 | 8/2004 | Gao et al. |
| 2004/0218806 A1 | 11/2004 | Miyamoto et al. |
| 2004/0263911 A1 | 12/2004 | Rodriguez et al. |
| 2005/0004774 A1 | 1/2005 | Volk et al. |
| 2005/0049990 A1 | 3/2005 | Milenova et al. |
| 2005/0147287 A1 | 7/2005 | Sakai et al. |
| 2005/0169517 A1 | 8/2005 | Kasai |
| 2005/0175243 A1 | 8/2005 | Luo et al. |
| 2005/0196035 A1 | 9/2005 | Luo et al. |
| 2006/0009011 A1 | 1/2006 | Barrett et al. |
| 2006/0048007 A1 | 3/2006 | Yuan et al. |
| 2006/0112038 A1 | 5/2006 | Luo |
| 2006/0289752 A1* | 12/2006 | Fukunishi ................ H01J 37/28 250/310 |
| 2007/0047800 A1 | 3/2007 | Hiroi et al. |
| 2007/0053580 A1 | 3/2007 | Ishikawa |
| 2007/0063548 A1 | 3/2007 | Eipper |
| 2008/0013784 A1 | 1/2008 | Takeshima et al. |
| 2008/0075352 A1 | 3/2008 | Shibuya et al. |
| 2009/0136121 A1 | 5/2009 | Nakagaki et al. |
| 2009/0157578 A1 | 6/2009 | Sellamanickam et al. |
| 2009/0171662 A1 | 7/2009 | Huang et al. |
| 2009/0305423 A1 | 12/2009 | Subramanian et al. |
| 2011/0026804 A1 | 2/2011 | Jahanbin et al. |
| 2012/0027285 A1 | 2/2012 | Shlain et al. |
| 2012/0054184 A1 | 3/2012 | Masud et al. |
| 2013/0165134 A1 | 6/2013 | Touag et al. |
| 2013/0279794 A1 | 10/2013 | Greenberg et al. |
| 2013/0304399 A1 | 11/2013 | Chen et al. |
| 2013/0318485 A1 | 11/2013 | Park et al. |
| 2014/0050389 A1 | 2/2014 | Mahadevan et al. |

FOREIGN PATENT DOCUMENTS

| | | |
|---|---|---|
| JP | 2001135692 A | 6/2000 |
| JP | 2003515942 A | 11/2000 |
| JP | 2004191187 A | 7/2004 |
| JP | 2004295879 A | 10/2004 |
| JP | 200447939 A | 12/2004 |
| JP | 2007225531 A | 9/2007 |
| JP | 200876167 A | 4/2008 |
| JP | 2008529067 A | 7/2008 |
| JP | 2010249547 A | 4/2009 |
| JP | 2009103508 A | 5/2009 |
| JP | 2010514226 A | 4/2010 |
| JP | 2010164487 A | 7/2010 |
| JP | 2011158373 A | 8/2011 |
| TW | 201203927 A | 1/2012 |
| TW | 201233095 A | 8/2012 |
| WO | 2011/155123 | 12/2011 |
| WO | 2013/140302 A1 | 9/2013 |
| WO | 2013/169770 A1 | 11/2013 |

OTHER PUBLICATIONS

Chernova, Sonia, and Manuela Veloso. "Multi-thresholded approach to demonstration selection for interactive robot learning." In Human-Robot Interaction (HRI), 2008 3rd ACM/IEEE International Conference on, pp. 225-232. IEEE, 2008.

Ban, Tao, and Shigeo Abe. "Implementing multi-class classifiers by one-class classification methods" In Neural Networks, 2006. IJCNN'06. International Joint Conference on, pp. 327-332. IEEE, 2006.

Tax, David MJ, and Piotr Juszczak. "Kernel whitening for one-class classification" In Pattern Recognition with Support Vector Machines, pp. 40-52. Springer Berlin Heidelberg, 2002.

Li, Te-Sheng, and Cheng-Lung Huang. ""Defect spatial pattern recognition using a hybrid SOM-SVM approach in semiconductormanufacturing."" Expert Systems with Applications 36.1 (Jan. 2009): 374-385.

Akay, Mehmet Fatith. "Support vector machines combined with feature selection of breast cancer diagnosis." Expert systems with applications 36, No. 2 (2009): 3240-3247.

Varewyck, Matthias, and J-P. Martens. "A practical approach to model selection for support vector machines with a Gaussian Kernel." Systems, Man, and Cybernetics, Part B: Cybernetics, IEEE Transactions on 41.2 (2011): 330-340.

Wang, Wenjian, et al. "Determination of the spread parameter in the Gaussian kernel for classification and regression." Neurocomputing 55.3 (2003): 643-663.

Xu, Zongben, Mingwei Dai, and Deyu Meng. "Fast and efficient strategies for mdoel selection of Gaussian suport vector machine." Systems, Man, and Cybernetics, Part B: Cybernetics, IEEE Transactions on 39.5 (2009): 1292-1307.

David M.J. Tax; Robert P. W. Duin, "Support Vector Data Description". Jan. 2004, Machine learning, vol. 54, pp. 45-66.

Vapnik, Vladimir N., Section 5.4 The Optimal Separating Hyperplane, The Nature of Statistical Learning Theory, Statistics for Engineering and Information Science, Second Edition, 2000, 1995 Srpinger-Verlag, New York, Inc. pp. 131-163.

Chih-Chung Chang and Chih-Jen Lin, "LIBSVM: A Library for Support Vector Machines," National Taiwan University (2001), updated Mar. 6, 2010, pp. 1-30.

Assaf Glazer and Moshe Sipper, "Evolving an Automatic Defect classification Tool," EvoWorkshops 2008, LNCS 4974 (Springer-Verlag, 2008), pp. 194-203.

LIBSVM—a Library for Support Vector Machines, as downloaded from ww.csie.ntu.edu.tw/~cjlin/libsvm on Jul. 27, 2010.

Scholkopf, Bernhard et al., "New Support Vector Algorithms," Neural Computation 12 (2000), Massachusetts Institute of technology, pp. 1207-1245.

Wang, Peng, Christian Kohler, and Ragini Verma. "Estimating cluster overlap on Manifolds and its Application to Neuropsychiatric Disorders." Computer Vision and Pattern Recognition, 2007. CVPR'07. IEEE Conference on. IEE, 2007.6 pages.

\* cited by examiner

CLOSED-LOOP AUTOMATIC DEFECT INSPECTION AND CLASSIFICATION

RELATED APPLICATION

This application is a continuation of U.S. patent application Ser. No. 13/948,118 filed on Jul. 22, 2013, the contents of which are hereby incorporated by reference.

FIELD OF THE INVENTION

The present invention relates generally to automated inspection, and specifically to methods and systems for detection and analysis of manufacturing defects.

BACKGROUND OF THE INVENTION

Automatic Defect Classification (ADC) techniques are widely used in inspection and measurement of defects on patterned wafers in the semiconductor industry. The object of these techniques is not only to detect the existence of defects, but to classify them automatically by type, in order to provide more detailed feedback on the production process and reduce the load on human inspectors. ADC is used, for example, to distinguish among types of defects arising from particulate contaminants on the wafer surface and defects associated with irregularities in the microcircuit pattern itself, and may also identify specific types of particles and irregularities.

Various methods for ADC have been described in the patent literature. For example, U.S. Pat. No. 6,256,093 describes a system for on-the-fly ADC in a scanned wafer. A light source illuminates the scanned wafer so as to generate an illuminating spot on the wafer. Light scattered from the spot is sensed by at least two spaced-apart detectors, and is analyzed so as to detect defects in the wafer and classify the defects into distinct defect types.

As another example, U.S. Pat. No. 6,922,482 describes a method and apparatus for automatically classifying a defect on the surface of a semiconductor wafer into one of a number of core classes, using a core classifier employing boundary and topographical information. The defect is then further classified into a subclass using a specific adaptive classifier that is associated with the core class and trained to classify defects from only a limited number of related core classes. Defects that cannot be classified by the core classifier or the specific adaptive classifiers are classified by a full classifier.

SUMMARY

Embodiments of the present invention that are described hereinbelow provide improved methods, systems and software for automated inspection and classification of defects.

There is therefore provided, in accordance with an embodiment of the present invention, inspection apparatus, including an imaging module, which is configured to capture images of defects at different, respective locations on a sample. A processor is coupled to process the images so as to automatically assign respective classifications to the defects, and to autonomously control the imaging module to continue capturing the images responsively to the assigned classifications.

In some embodiments, the processor is configured to instruct the imaging module, after assigning the classifications to a first set of the defects appearing in the images captured by the imaging module, to capture further images of a second set of the defects responsively to a distribution of the classifications of the defects in the first set. The processor may be configured to count respective numbers of the defects belonging to one or more of the classifications, and to instruct the imaging module to continue capturing the further images until at least one of the numbers satisfies a predefined criterion. Typically, the processor is configured to cause the imaging module to continue capturing the further images until a number of the defects belonging to a given classification reaches a predefined threshold, and then to terminate inspection of the sample.

In one embodiment, the apparatus includes a user interface, wherein the processor is coupled to process the images and control the imaging module in response to instructions received from a user via the user interface. Additionally or alternatively, the processor is coupled to process the images and control the imaging module in response to instructions received from a server via a network.

In some embodiments, the processor is configured to identify one or more of the defects for further analysis using a different inspection modality. The imaging module may include multiple detectors, including at least first and second detectors configured to capture images in accordance with different, respective modalities, and the processor may be configured to identify the one or more of the defects by processing first images captured by the first detector and to instruct the imaging module to capture second images of the one or more of the defects using the second detector. In a disclosed embodiment, the processor is configured to identify the one or more of the defects, based on the first images, as belonging to a specified class, and to choose the second detector for capturing the second images depending on the specified class. The multiple detectors may be selected from a group of detectors consisting of electron detectors, X-ray detectors, and optical detectors.

In one embodiment, the apparatus includes a memory, which is configured to store definitions of a plurality of defect classes in terms of respective classification rules in a multi-dimensional feature space, and the processor is configured to extract features of the defects from the images, and to assign the respective classifications by applying the classification rules to the extracted features.

In a disclosed embodiment, the imaging module includes a scanning electron microscope (SEM), and the sample includes a semiconductor wafer.

There is also provided, in accordance with an embodiment of the present invention, a method for inspection, which includes capturing images of defects at different, respective locations on a sample using an imaging module. The images are automatically processed so as to assign respective classifications to the defects, and autonomously controlling the imaging module to continue capturing the images responsively to the assigned classifications.

The present invention will be more fully understood from the following detailed description of the embodiments thereof, taken together with the drawings in which:

DETAILED DESCRIPTION OF EMBODIMENTS

Figure 1:
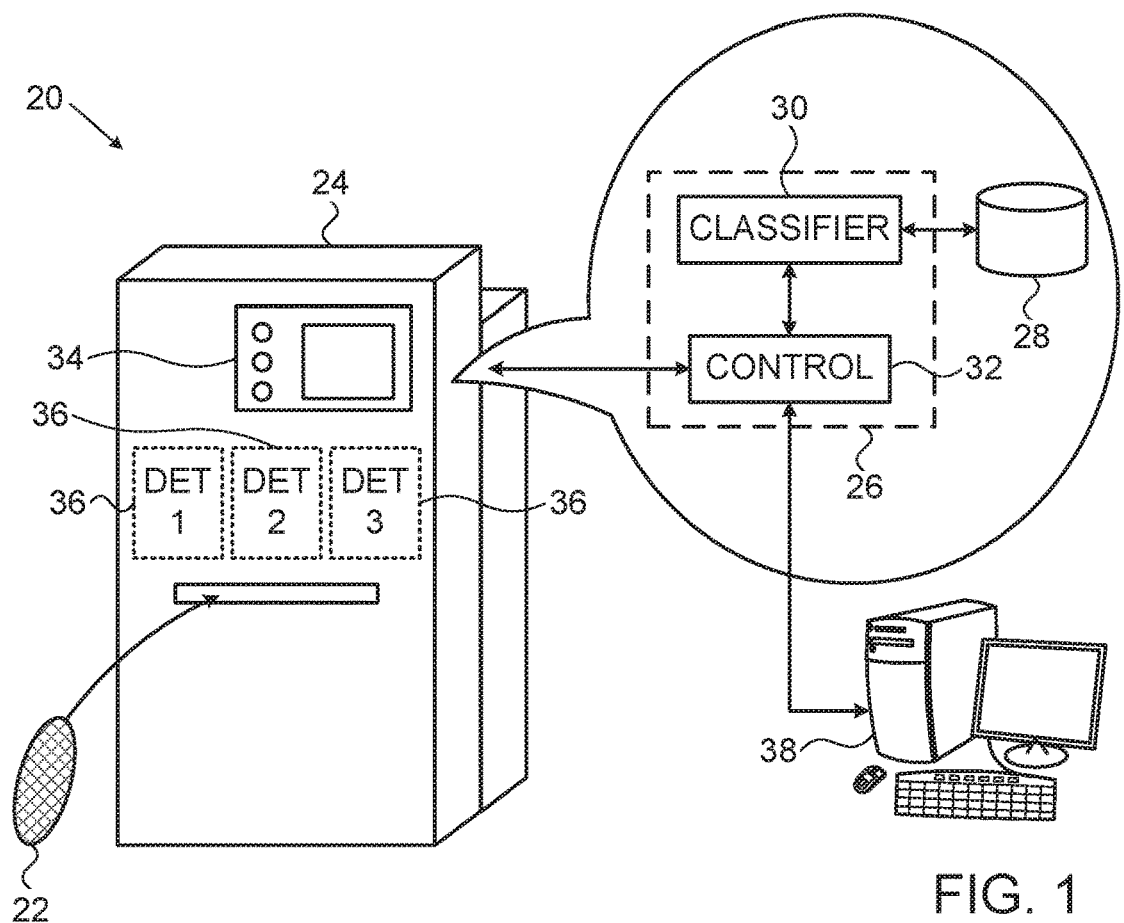
FIG. 1 is a schematic, pictorial illustration of a defect inspection and classification system, in accordance with an embodiment of the present invention.

In common models of ADC, the image capture and image analysis functions are separate: An imaging system, such as a scanning electron microscope (SEM), will first capture a certain number of images of different locations on a sample, such as a semiconductor wafer, and these images will then be passed to an ADC system for post hoc analysis. Because it is difficult to predict a priori how many defects of any given type will be found on a given wafer, the post hoc approach will sometimes yield far more images than are needed for effective process analysis. At other times, the SEM will yield insufficient information, so that the wafer will have to be rescanned. Such additional scans may be aimed at providing additional images or information that is specific for the class of a particular defect or group of defects. For example, particle-type defects will be analyzed by energy-dispersive X-ray (EDX) analysis, and images of electrical short circuits may be acquired in tilt mode, at a different angle of imaging. The above sorts of situations result in wasted time and testing resources.

Embodiments of the present invention address these problems by integrating ADC capability with an imaging module, such as a SEM, an optical inspection unit, or any other suitable type of inspection device. An ADC processor analyzes each image that the imaging module produces in order to classify the defects and determine whether they are "interesting," according to user-defined criteria. For example, a given user may decide that he is interested only in certain defect classes, such as particle-type defects, and wishes to inspect fifty such defects per wafer. In this case, the imaging module may scan different locations, randomly selected, on each wafer until it has captured images of fifty particle-type defects. Classifying the defect type that has been captured by the imaging module at each location is done online by integrating ADC capability with the imaging module. In the present example, the imaging module will output fifty images of particle-type defects from each wafer and will then move on to process the next wafer.

In other embodiments, when the imaging module supports multiple inspection modalities, the integrated ADC processor may classify defects according to defect type, and may then instruct the imaging module to apply different additional inspection operations to the different types. This sort of iterative inspection loop can be used multiple times at any given defect location, depending on classification results. For example:

The ADC processor may classify a given defect as particle by analyzing a SEM image of the defect, and then, based on this classification, instruct the imaging module to perform EDX analysis at the same wafer location. It may then, based on the EDX analysis, perform a second classification step using the new information acquired from the EDX.

The ADC processor may classify a defect as an electrical short by SEM image analysis, and may then, based on this classification, instruct the imaging module to acquire a tilt image. The ADC processor may then perform a second classification step using the new information acquired from the tilt image.

When the ADC processor initially classifies a defect as belonging to an unknown defect class, it may instruct the imaging module to perform optical image acquisition, and may then, based on analysis of the optical image, perform a second classification of the defect using the new information acquired from the optical image.

These procedures reduce the time needed for analyzing some of the defect classes by performing necessary analysis and re-imaging based on close-loop classification. All the necessary information may be gathered in one scan over the defect locations, rather than having to scan the wafer multiple times in multiple different modalities.

Thus, embodiments of this invention enable an imaging module, such as a SEM, to use its resources more efficiently: Integration of ADC capability with the imaging module allows it to capture prescribed numbers of images of particular types of defects and to stop capturing images once it has met its quota, for example, rather than wasting time on superfluous images. Additionally or alternatively, as explained above, classification results of defects captured initially on a given wafer can be used to automatically guide the imaging module to capture subsequent images in particular locations using particular modalities and settings. Based on initial ADC results, the imaging module can be guided to perform further analysis at specific wafer locations using another inspection modality, such as energy-dispersive X-ray (EDX) analysis or other forms of material analysis and different image acquisition modes, including optical modalities, as well as inspection by a human operator.

FIG. 1 is a schematic, pictorial illustration of a system 20 for automated defect inspection and classification, in accordance with an embodiment of the present invention. A sample, such as a patterned semiconductor wafer 22, is inserted into an imaging module 24. This module typically comprises one or more detectors 36, for example, a scanning electron microscope (SEM) or an optical inspection device or any other suitable sort of inspection apparatus that is known in the art. Module 24 typically scans the surface of wafer 22, senses and captures image data, and outputs images of defects on the wafer. The term "images" is used broadly in the context of the present patent application and in the claims to refer to data regarding any sort of local features that can be associated with a given defect location. Such features may include, for example, the size, shape, scattering intensity, directionality, and/or spectral qualities, as well as any other suitable features that are known in the art.

A processor 26 receives and processes the images that are output by imaging module 24. Processor 26 comprises a classifier module 30, which processes the images to extract relevant inspection feature values from the images of wafer 22. Typically, module 30 assigns the defects to respective classes by applying classification rules, which are stored in a memory 28, to the feature values. Classifier module 30 passes the defect classifications to a control module 32, which controls the ongoing image capture by inspection module accordingly, as described in greater detail hereinbelow. These operations of processor 26 are typically carried out autonomously, i.e., without operator intervention during the inspection process, based on predefined criteria and instructions.

Processor 26 typically comprises a general-purpose computer processor or a group of such processors, which may be integrated inside the enclosure of imaging module 24 or coupled to it by a suitable communication link. The processor uses memory 28 to hold defect information and classification rules. Processor 26 is coupled to a user interface 34, through which a user, such as an operator of system 20, is able to define operating criteria to be applied in processing images and controlling imaging module 24. Processor 26 is programmed in software to carry out the functions that are described herein, including the functions of classifier module 30 and control module 32. The software may be downloaded to the processor in electronic form, over a network, for example, or it may, alternatively or additionally, be stored in tangible, non-transitory storage media, such as optical, magnetic, or electronic memory media (which may be comprised in memory 28, as well). Alternatively or additionally, at least some of the functions of processor 26 may be implemented in dedicated or programmable hardware logic.

Classifier module 30 may apply any suitable sort of ADC algorithm that is known in the art to the defect image data. In one embodiment, for example, module 30 runs multiple classifiers, including both single-class and multi-class classifiers. These classifiers use classification rules specified in a multi-dimensional feature space, which define the defect classes in terms of respective regions in the feature space. Module 30 extracts features of the defects from the images provided by module 24, and assigns the defect classifications by applying the classification rules to the extracted features. The multi-class classifier sorts the defects on this basis among a set of predefined defect classes (such as particle defects, pattern defects, etc.); while the single-class classifiers are defined respectively for each class and classify defects as being within or outside the class boundaries. Classifiers of this sort are described in detail, for example, in U.S. patent application Ser. No. 12/844,724, filed Jul. 27, 2010, whose disclosure is incorporated herein by reference.

Processor 26 typically communicates, via a network, for example, with an ADC server 38. The server provides processor 26 with "recipes" for defect analysis and classification and may update these recipes from time to time. Processor 26 reports defect inspection and classification results to the server. Because classification is performed locally at imaging module 24, the volume of data that must be communicated to server 38 is greatly reduced, relative to systems in which raw images are transmitted to the ADC server. Additionally or alternatively, processor 26 may convey some image data and/or intermediate classification results to server 38 for further processing.

Figure 2:
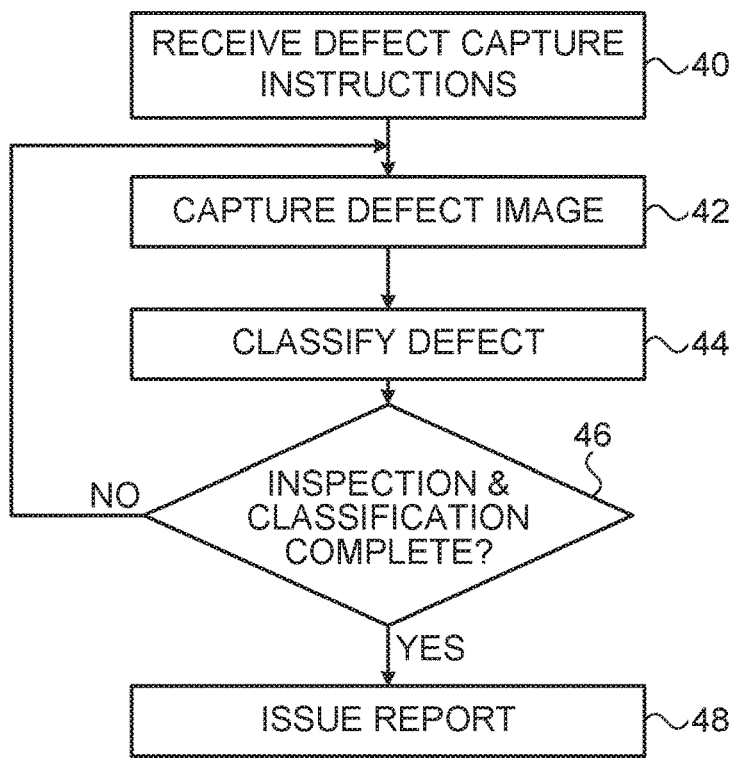
FIG. 2 is a flow chart that schematically illustrates a method for closed-loop defect inspection and classification, in accordance with an embodiment of the present invention.

FIG. 2 is a flow chart that schematically illustrates a method for closed-loop defect inspection and classification, in accordance with an embodiment of the present invention. The method is described here, for the sake of convenience and clarity, with reference to the specific architecture of system 20, but it may similarly be implemented in other inspection systems with integrated defect classification capabilities. The method, as described below, takes advantage of the availability of multiple detectors 36 and imaging modalities in imaging module 24, although aspects of the method may also be applied in single-modality systems.

Control module 32 receives defect capture instructions, at an instruction input step 40. These instructions may be programmed by a user, such as an operator of system 20, via user interface 34, for example, or they may alternatively be downloaded to the system via a network or conveyed to the system by any other suitable means. Typically, the instructions define one or more criteria applying to the distribution of defects that system 20 is to seek. For example, the instructions may specify one or more classes of defects and the number of defects in each such class that the system should attempt to find on each wafer. The instructions may also specify a timeout condition indicating, for example, that inspection of a wafer should terminate after capturing images of some maximal number of possible defect sites without reaching the target defect distribution. Additionally or alternatively, the instructions may specify additional image acquisition modes to be applied to one or more classes of defects, based on classification decisions made at each iteration of a closed-loop inspection process. Such image acquisition modes may include EDX, tilt imaging, optical imaging, and any other information that can be collected by detectors 36 during the scan.

Control module 32 instructs imaging module 24 to capture an image of a defect on wafer 22, at an image capture step 42. Module 24 passes the image (and/or extracted features of the image) to classifier module 30, at a defect classification step 44. Module 30 applies the appropriate rules to the defect features in order to assign the defect to a particular class. Module 30 may optionally tag the defect for further analysis, such as when the defect cannot be classified with confidence using the rules in memory 28 or when the instructions provided at step 40 instruct processor 26 that certain types of defects should be so identified. Depending on these instructions, these tagged defects may be processed further using another imaging modality in imaging module 24. Alternatively or additionally, certain tagged defects may be passed to a human inspector and/or to another inspection machine, such as an X-ray analysis tool.

Control module 32 receives and records the classification of each defect from classifier module 30, at a distribution checking step 46. At this step, if the defect is of a type that has been tagged for further imaging and classification, module 32 may return to step 42 and instruct imaging module 24 to capture another image of the same defect using another specified modality (such as EDX, tilt, or optical imaging, as explained above). Additionally or alternatively, module may, at step 46, compare the distribution of defects classified so far to the instructions that were received at step 40. If the instructions have not yet been fulfilled (or timed out), the control module returns to step 42 and instructs imaging module 24 to capture a defect image at another location.

If at step 46 the instructions have been fulfilled (by having performed all specified imaging and classification steps and having collected the required number of images of defects belonging to a specified class or classes, for example) or timed out, module 32 terminates the inspection of wafer 22 and issues a report, at an inspection completion step 48. The report may include images of the defects in the class or classes specified by the instructions, or it may simply contain tabulated defect data with respect to wafer 22. System 20 may then proceed to inspection of the next wafer.

Although the above method is described, for the sake of clarity, in the specific context of defect classification in system 20 and imaging module 24, these methods may similarly be applied in other systems and applications of automated inspection, and are in no way limited to semiconductor wafer defects or to SEM images. It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

What is claimed is:

1. A system comprising:
a memory; and
a processor, operatively coupled with the memory, to:
receive a first image of a defect on a sample from a first image acquisition mode, wherein the first image acquisition mode uses a first type of detector that collects a first type of image information, wherein the first type of detector is a scanning electronic microscope (SEM);
assign a first classification to the defect on the sample based on the first image;

determine, based on the first classification to the defect, whether to capture a second image of the defect on the sample and which second image acquisition mode to use;

select, based on the first classification to the defect, a second type of detector from a group consisting of an optical inspection tool, a dispersive X-ray tool, and the SEM acquiring a tilt image with respect to the first image;

responsive to determining that a second image of the defect is to be captured from the second image acquisition mode, instruct the selected second type of detector to capture the second image and to collect a second type of image information from the second image;

iteratively update, using an integrated closed-loop automatic defect classification (ADC) algorithm, defect classification criteria based on the second type of image information collected by the second type of detector; and assign a second classification to the defect based on the updated defect classification criteria applied on the second image.

2. The system of claim 1, wherein the processor is further to:

determine that information from the first image of the defect is insufficient to classify the defect, wherein the determination of whether to capture the second image is based on the determination that the information from the first image of the defect is insufficient.

3. The system of claim 2, wherein the instructing of the second type of detector is based on the determination that the information from the first image of the defect is insufficient.

4. The system of claim 1, wherein the processor is further to:

determine a number of defects on the sample that have been classified; and determine to capture additional images of additional defects on the sample based on whether the number of defects on the sample that have been classified satisfies a threshold number.

5. A method comprising:

receiving a first image of a defect on a sample from a first image acquisition mode, wherein the first image acquisition mode uses a first type of detector that collects a first type of image information, wherein the first type of detector is a scanning electronic microscope (SEM);

assigning a first classification to the defect on the sample based on the first image;

determining, by a processor, based on the first classification of the defect, whether to capture a second image of the defect on the sample and which second image acquisition mode to use;

selecting, based on the first classification to the defect, a second type of detector from a group consisting of an optical inspection tool, a dispersive X-ray tool, and the SEM acquiring a tilt image with respect to the first image;

responsive to determining that a second image of the defect is to be captured from the second image acquisition mode, instructing the selected second type of detector to capture the second image and to collect a second type of image information from the second image;

iteratively updating, using an integrated closed-loop automatic defect classification (ADC) algorithm, defect classification criteria based on the second type of image information collected by the second type of detector; and assigning a second classification to the defect based on the updated defect classification criteria applied on the second image.

6. The method of claim 5, further comprising:

determine that information from the first image of the defect is insufficient to classify the defect, wherein the determination of whether to capture the second image is based on the determination that the information from the first image of the defect is insufficient.

7. The method of claim 6, wherein the instructing of the second type of detector is based on the determination that the information from the first image of the defect is insufficient.

8. The method of claim 5, further comprising:

determine a number of defects on the sample that have been classified; and determine to capture additional images of additional defects on the sample based on whether the number of defects on the sample that have been classified satisfies a threshold number.

9. A non-transitory computer readable medium comprising instructions, which when executed by a processor, cause the processor to perform operations comprising:

receiving a first image of a defect on a sample from a first image acquisition mode, wherein the first image acquisition mode uses a first type of detector that collects a first type of image information, wherein the first type of detector is a scanning electronic microscope (SEM);

assigning a first classification to the defect on the sample based on the first image;

determining, based on the first classification to the defect, whether to capture a second image of the defect on the sample and which second image acquisition mode to use;

selecting, based on the first classification to the defect, a second type of detector from a group consisting of an optical inspection tool, a dispersive X-ray tool, and the SEM acquiring a tilt image with respect to the first image;

responsive to determining that a second image of the defect is to be captured from the second image acquisition mode, instructing the selected second type of detector to capture the second image and to collect a second type of image information from the second image;

iteratively updating, using an integrated closed-loop automatic defect classification (ADC) algorithm, defect classification criteria based on the second type of image information collected by the second type of detector; and assigning a second classification to the defect based on the updated defect classification criteria applied on the second image.

10. The non-transitory computer readable medium of claim 9, wherein the operations further comprise:

determining that information from the first image of the defect is insufficient to classify the defect, wherein the determination of whether to capture the second image is based on the determination that the information from the first image of the defect is insufficient.

11. The non-transitory computer readable medium of claim 10, wherein the instructing of the second type of detector is based on the determination that the information from the first image of the defect is insufficient.

* * * * *